United States Patent [19]

Bleckmann et al.

[11] Patent Number: 5,099,198
[45] Date of Patent: Mar. 24, 1992

[54] CIRCUIT CONFIGURATION FOR MONITORING THE FINAL STAGES OF A PLURALITY OF VALVES

[75] Inventors: Hans-Wilhelm Bleckmann, Bad Nauheim; Heinz Loreck, Frankfurt am Main; Michael Zydek, Langgoens/Cleeberg, all of Fed. Rep. of Germany

[73] Assignee: Alfred Teves GmbH, Frankfurt am Main, Fed. Rep. of Germany

[21] Appl. No.: 558,946

[22] Filed: Jul. 27, 1990

[30] Foreign Application Priority Data

Aug. 1, 1989 [DE] Fed. Rep. of Germany ....... 3925418

[51] Int. Cl.⁵ ............................................. G01R 31/14
[52] U.S. Cl. ................................... 324/511; 324/418; 340/644
[58] Field of Search .............. 324/418, 511, 550; 340/644; 361/191; 73/129

[56] References Cited

U.S. PATENT DOCUMENTS

| | | | |
|---|---|---|---|
| 2,902,642 | 9/1959 | Voegtlen | 324/418 |
| 3,924,178 | 12/1975 | Lockyer et al. | 324/418 |
| 4,173,031 | 10/1979 | Leichle | 361/191 |
| 4,628,268 | 12/1986 | Matsubara | 324/418 |
| 4,692,697 | 9/1987 | Bray | 324/418 |
| 4,961,051 | 10/1990 | Tjebben | 324/418 |

FOREIGN PATENT DOCUMENTS 0075931 4/1983 European Pat. Off. .
2026705 2/1980 United Kingdom .

Primary Examiner—Kenneth A. Wieder
Assistant Examiner—Maura K. Regan
Attorney, Agent, or Firm—Robert P. Seitter; J. Gordon Lewis

[57] ABSTRACT

A circuit configuration for monitoring the final stages of a plurality of valves, particularly the power transistors (LT1-LT4) and their circuitry, for defects as well as for leakage currents or by-path currents comprises a comparator circuit (1), an OR-link (2) and of a further comparator element (XOR4). By way of the monitoring circuit, the actuation connections (S1-S4) of electromagnetically operable valves are connected to a sole output (A3). By applying short test pulses to the actuation inputs (E1-E4) of the final stages (LT1-LT4) and by comparing the signal variation at the output (A3) with the test pulse variation defects, leakage currents and the like are detected.

12 Claims, 1 Drawing Sheet

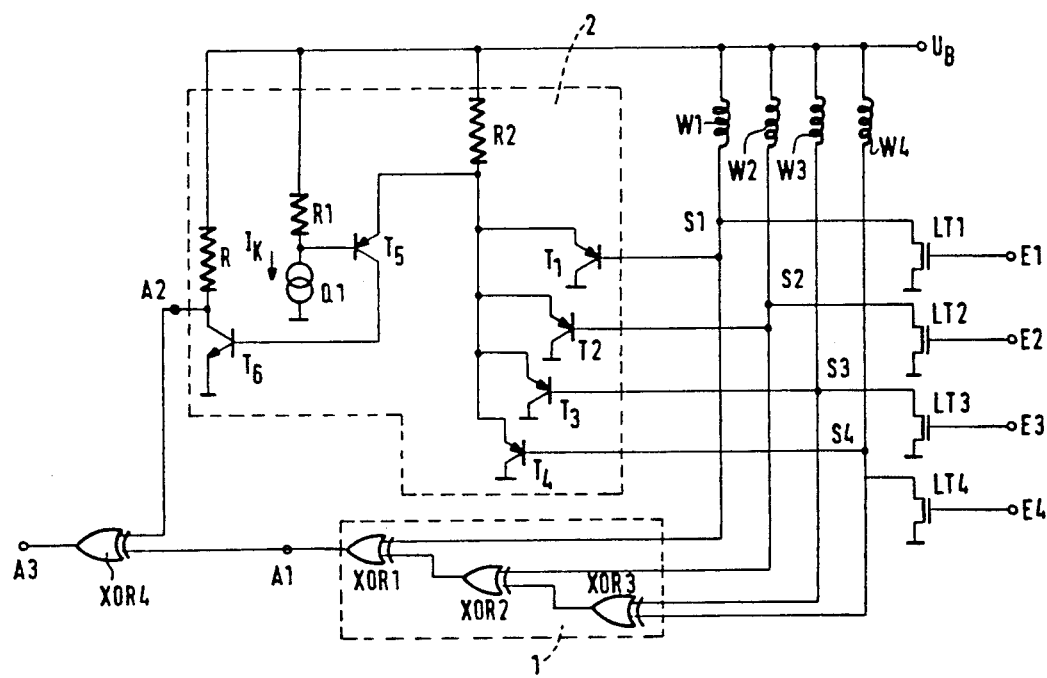

CIRCUIT CONFIGURATION FOR MONITORING THE FINAL STAGES OF A PLURALITY OF VALVES

BACKGROUND OF THE INVENTION

This present invention relates to a circuit configuration for monitoring the final control circuitry stages of a plurality of electrically or electromagnetically operable valves such as the braking pressure control valves of an anti-lock control system and/or of a traction slip control system, wherein the final stages are fed with short test pulses in accordance with a predetermined pattern.

Monitoring individual components and circuits for proper condition and proper operation in particular is of major importance in apparatus or systems which are critical in terms of safety such as automotive vehicle brake systems with an anti-lock control system (ABS) or a traction slip control system (ASR). An imminent failure of control, namely must be recognize and signalized in order to warn the driver and to at least ensure braking without defection control by switching off the failed control system.

A number of circuit configurations for monitoring the entire anti-lock control system and individual circuit elements or components are known. See, for example, German Patent Specification (DE-PS) No. 26 12 356, German Published Patent Application (DE-OS) No. 32 34 637. Among the critical components of an anti-lock control system for safety are the braking pressure control valves by means of which the braking pressure is kept constant, reduced and reincreased in the event of control. Typically, electromagnetically operable hydraulic valves are used for this braking pressure control operation. A defect in the actuation circuit, an electrical by-path or a leakage current should to be recognized immediately since such a defect can jeopardize control or even the braking operation itself.

Since a brake system always requires a large number of such braking pressure control valves, such as six or eight wheel valves (inlet valves and outlet valves) and further valves for controlling the auxiliary pressure, there is a need for a monitoring circuit requiring only few components per valve and a small number of elements overall. It is thus an object of this invention to develop such a circuit configuration while requiring only a small number of connections and arrangements of wiring within the electronic control unit.

SUMMARY OF THE INVENTION

It has been found out that this object is achieved by means of a circuit configuration of the type referred to whose particular feature is that the actuation connections of the valves, the valve excitation windings, are connected by way of a comparator circuit comprising a chain of non-equivalent elements or equivalent elements and by way of and OR-link and that the output signal of the comparator circuit and the output signal of the OR-link are feedable to a further comparator element whose output signal is evaluatable as a function of the test pulses in order to monitor the final stages.

A fundamental advantage of the inventive circuit is that, by way of the comparator circuit, the OR-link and the further comparator element, the signals released by the test signals are connected to one sole connection or output, respectively. The signal variation at this output, as compared with the test pulses fed in accordance with a specified pattern, contains information on the condition of the monitored circuitry. By means of a microcomputer such as the existing microcomputer in the control unit, it is possible to evaluate the signal variation at the output of the circuit by comparing it with the test pulses.

According to one embodiment of the present invention, the comparator circuit comprises of a chain of non-equivalent elements, each with two inputs and one output. The further comparator element preferably is of the same circuit design. The test pulses expediently are shorter than the response or reaction time of the braking pressure control valves so that this testing may be performed permanently and will remain without any influence on the braking pressure variation.

According to a further embodiment of the circuit in accordance with the present invention the OR-link is designed as a "wired OR" and in particular reacts to leakage currents or by-path currents such as may occur because of defective insulation of the valve connection lines. The comparator circuit detects whether the actuation transistors in the final stages are properly connected whereupon the saturation voltage will sink below a predetermined threshold.

The monitoring circuit in accordance with the present invention is thus characterized by a smaller number of internal circuitry elements and by the limitation to but one output, or to but one connection for the evaluating microcomputer. Nevertheless, a reliable monitoring of all connected braking pressure control valves for leakage currents, by-paths or transistor defect is achieved.

BRIEF DESCRIPTION OF THE DRAWING

Further characteristics, advantages and applications of this invention will become evident from the following representation of one embodiment, reference being made to the accompanying drawing wherein the single FIGURE illustrates a wiring diagram.

DETAILED DESCRIPTION

The represented embodiment is a monitoring circuit for the pressure control valves of an anti-lock control system (ABS) or rather of an anti-lock-controlled brake system. The excitation windings W1-W4 of the vales are symbolically represented. For the sake of clarity, only four valves are illustrated that can be connected or logically combined in the manner illustrated for monitoring purposes. It will be appreciated that there are systems of this type that have eight or more valves depending on the particular design and number of control channels.

In general, electromagnetically operable multi-directional valves are used as braking pressure control valves. In the present in instance the valves have only two operating positions. In the illustrated example, each of the final stages or drivers for changing over the individual valves contains one power transistor LT1, LT2, LT3 and LT4. By way of connections E1-E4 leading to the gates of these transistors, the transistors are actuated by the output signals of a microcontroller, or microcomputer, or of a corresponding logic generating the control signals.

The remaining electronic components represented in the wiring diagram form part of the inventive monitoring circuit. By means of non-equivalent elements XOR1, XOR2, XOR3 (exclusive OR), circuits the actuation connections S1-S4 of the valve excitation windings W1-W4 are connected to one output A1. The non-equivalent elements XOR1, XOR2, XOR3 have two inputs and one output each and are combined into a chain, also called a parity chain, in that in each case one actuation connection of a valve excitation winding is combined with the output signal of a non-equivalent element In the illustrated configuration it is possible to connect any number of valves, or valve excitation windings to the single output A1.

The transistors $T_1$-$T_4$ form part of an OR-link 2 whose output signal is formed by means of further transistors $T_5$-$T_6$ and is available at an output A2. Connected at the base of transistor $T_5$ are a current source Q1, on the one side towards ground, and an ohmic resistor R1 on the other side, that is connected towards the voltage source $U_B$. The emitter of transistor $T_5$ is connected with the voltage source $U_B$ by way of a low-impedance resistor R2. Resistor R at the collector of transistor $T_6$ provides current limitation. The current source Q1, the base resistor R1 and the emitter resistor R2 are selected so as to ensure that the two transistors $T_5$ and $T_6$ carry a current. That is, that there will be the signal condition L (low) at output A2, as long as the transistors $T_1$-$T_4$ of the OR-link 2 are non-conductive. In one embodiment the battery voltage $U_B$ was 12 volts. The constant current source Q1 carried a current $I_k$ of 1 mA. As the resistor R1 in this case was 1 Kohm, the potential of the base of transistor $T_5$ was approximately 11 volts.

As long as the power transistors LT1-LT4 are not actuated, the transistors T1-T4 will be non-conductive as each transistor base, which in each case is connected to $U_B$ by way of one of the low-impedance excitation windings W1-W4, is at the potential of voltage source $U_B$. The current flowing by way of the emitter resistor R2 and by way of the transistors $T_5$, $T_6$ will cause a decrease in voltage which acts on the base-emitter path of the transistors $T_1$-$T_4$ in the blocking direction. The two outputs A1 and A2 of the comparator circuit 1 and of the OR-link 2 finally are united into one sole output signal at output A3 by way of a further comparator element XOR4 which may have the same circuit design as the described non-equivalent exclusive OR elements XOR1, XOR2, XOR3.

The illustrated monitoring circuit functions as follows: For monitoring, test pulses are applied to the inputs E1, E2, E3, E4 and, hence, to the gates of the final stages or power transistors LT1-LT4 in accordance with a predetermined pattern, and preferably in a delayed manner. The response time or reaction time of the braking pressure control valves with the excitation windings W1-W4 lies above the duration of these test pulses so that these pulses will not influence the braking pressure variation. Any test pulse at the inputs E1-E4 will cause a through-connection of the corresponding power transistor LT1-LT4, a signal change at the corresponding input of the comparator circuit 1 and at its output A1. Furthermore, if the corresponding power transistor is intact, any test pulse will cause the appertaining transistor at the input of the OR-link 2 to be switched into the conductive state. This will cause the transistors $T_6$ and $T_6$ to become non-conductive and, hence, the output signal A2 to change from L to H. By means of a comparison with the test pulse, it is possible to recognize at output A3 whether all components are in proper working order.

The OR-link also reacts to leakage currents or by-paths which, independently of the actuation of the power transistors LT1-LT4, will cause a drop in voltage at one or at several of the excitation windings W1-W4. The drop in voltage on the low-impedance resistor R2 is namely very low even with transistors $T_5$, $T_6$ connected. Consequently, the corresponding transistor $T_1$-$T_4$ of the OR-link 2 become current-carrying in the event of a relatively small leakage current or by-path current by way of one of the excitation windings W1-W4. Thereby the voltage drop on R2 is increased so that $T_5$ and, hence, $T_6$ also become non-conductive. This, again, is detectable by means of a signal change at output A2 of the OR-link 2 and, hence, also at output A3 of the monitoring circuit.

Consequently, a certain signal variation at output A3 will correspond to the signal variation at inputs E1-E4 wherefore a correspondingly programmed computer, comparing the signal variation at the input of the signals E1-E4 with the reaction, or with the signal variation at the output A3, can recognize whether everything is in proper working order or whether there are leakage currents or by-path currents in the valve connection paths. The defect of a power transistor, for example, too high a saturation voltage or a short circuit, will be detected in the same manner.

Circuits of the type of the OR-link 2 also are referred to as a "wired OR". That is, an input to either one of transistor T1, T2, T3 or T4 will cause a signal change at output A2. In the inputs of each wired OR there is one of the transistors $T_1$-$T_4$. The transistors $T_5$ and $T_6$ in the illustrated combination have the function of a comparator comparing the potential at the emitter of the transistor $T_5$ with the fixed potential at the base of this transistor $T_5$. The potential at the emitter of the transistor $T_5$ approaching the base potential of transistor $T_5$ because of a leakage current or a by-path current by way of any one of the windings W1 through W4, will result in a change-over of transistors $T_5$ and $T_6$ into the non-conductive state and, hence, in a signal change at output A2.

What is claimed is:

1. A circuit configuration for monitoring the final control circuitry stages of a plurality of electromagnetically operatable valves, wherein the final stages are fed with short test pulses in accordance with a predetermined pattern, wherein the actuation connection (S1-S4) of the valves are connected by way of a comparator circuit comprising a chain of exclusive OR circuits (XOR1), XOR2, XOR3) and by way of an OR-like (2) and wherein the output signal of the comparator circuit (1) which incorporates said exclusive circuits and the output signal of the OR-like (2) are feedable to a further comparator element (XOR4) whose output signal is evaluatable as a function of the test pulses to monitor the final stages (LT1-LT4).

2. A circuit configuration as claimed in claim 1, wherein the comparator circuit (1) which comprises a chain of said exclusive OR circuits (XOR1, XOR2, XOR3) with each including two inputs and one output.

3. A circuit configuration as claimed in claim 2, wherein the further comparator element (XOR4) is an exclusive OR circuit with two inputs and one output.

4. A circuit configuration as claimed in claim 3, wherein the test pulses are shorter than the reaction time of the valves.

5. A circuit configuration as claimed in claim 4, wherein the OR-link (2) is arranged as a "wired OR" and reacts to leakage currents and by-path currents.

6. A circuit for monitoring final control circuitry stages of a plurality of electromagnetically operable valves, said circuit comprising:
- a plurality of windings of electromagnetically operable valves;
- a final control circuit stage connected to said plurality of windings;
- signal means for supplying test pulses in a predetermined sequence to said final control circuitry stage;
- a first comparator circuit, including a chain of exclusive OR circuits, for developing a first output signal related to said test pulses;
- an OR-link for detecting current flow and for developing a second output signal when such current flow is detected;
- and a second comparator circuit responsive to said first output signal and said second output signal for developing a final output signal which can be compared with said test pulses.

7. A circuit according to claim 6 wherein the duration of said test pulses is shorter than the reaction time of said electromagnetically operable valves.

8. A circuit according to claim 7 wherein said OR-link detects current flow caused by the presence of said test pulses and current flow in the absence of said test pulses.

9. A circuit according to claim 8 wherein said chain of exclusive OR circuits is a parity chain with each exclusive OR circuit having two inputs and one output.

10. A circuit according to claim 9 wherein said second comparator circuit is an exclusive OR circuit having two inputs and one output.

11. A circuit according to claim 10 wherein said OR-link is arranged as a "wired OR."

12. A circuit according to claim 11 wherein said final control circuitry stage includes a plurality of power transistors, one for each of said windings, and each of said power transistors has a connection to said first comparator circuit.

* * * * *